(12) United States Patent
Kim

(10) Patent No.: US 7,411,299 B2
(45) Date of Patent: Aug. 12, 2008

(54) PASSIVATION FILM OF SEMICONDUCTOR DEVICE

(75) Inventor: Sang Deok Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/702,299

(22) Filed: Feb. 5, 2007

(65) Prior Publication Data

US 2007/0132042 A1    Jun. 14, 2007

Related U.S. Application Data

(62) Division of application No. 11/018,698, filed on Dec. 21, 2004, now Pat. No. 7,229,912.

(30) Foreign Application Priority Data

Jul. 13, 2004    (KR) .......................... 10-2004-54510

(51) Int. Cl.
*H01L 23/48* (2006.01)

(52) U.S. Cl. ...................................... 257/750; 257/751

(58) Field of Classification Search ................. 257/750, 257/751
See application file for complete search history.

(56) References Cited

U.S. PATENT DOCUMENTS

| 6,228,780 B1 | 5/2001 | Kuo et al. |
| 6,391,795 B1 | 5/2002 | Catabay et al. |
| 2002/0102779 A1 | 8/2002 | Yang |

OTHER PUBLICATIONS

Official Office Action for Chinese Patent Application No. 200510005526.X.
Official action issued in corresponding Taiwanese application No. 93138751 filed Dec. 14, 2004.

*Primary Examiner*—Douglas M Menz
(74) *Attorney, Agent, or Firm*—Marshall, Gerstein & Borun LLP

(57) ABSTRACT

Disclosed are a method of manufacturing a semiconductor device and a structure of a semiconductor device. A method of forming a passivation film of a semiconductor device comprises the steps of forming metal wires on a semiconductor substrate, forming a buffer oxide film being a first passivation film on the metal wires, wherein the buffer oxide film can mitigate damage by plasma, forming a high density plasma film being a second passivation film on the buffer oxide film, and forming a third passivation film on the second passivation film. According to the present invention, it is possible to significantly reduce the leakage current between a select source line and a common source line.

5 Claims, 3 Drawing Sheets

PASSIVATION FILM OF SEMICONDUCTOR DEVICE

BACKGROUND

1. Field of the Invention

The present invention relates to a method of manufacturing a semiconductor device and a structure of a semiconductor device. More specifically, the present invention relates to a method of forming a passivation film of a semiconductor device and a structure of a passivation film of a semiconductor device in which the leakage current between a select source line and a common source line can be reduced significantly.

2. Discussion of Related Art

Generally, a semiconductor memory device is classified into volatile memory devices in which stored information is lost as the supply of power is stopped, and non-volatile memory devices in which information continues kept even when the supply of power is stopped. The non-volatile memory devices include an EPROM (Erasable Programmable Read Only Memory), an EEPROM (Electrically Erasable Programmable Read Only Memory), a flash memory and the like.

The flash memory devices are classified into a NOR type and a NAND type depending upon the configuration of a cell. A cell array region of the NAND type flash memory is composed of a number of strings. One string is connected to 16 or 32 cells. Each string includes a string select transistor, a plurality of cell transistors and a ground select transistor, all of which are serially connected. A drain region of the string select transistor is connected to a bit line and a source region of the ground select transistor is connected to a common source line.

In this NAND type flash memory device, a high density plasma (hereinafter, referred to as 'HDP') film is used as a passivation film. The HDP film is formed by a chemical vapor deposition (CVD) method so that between-metal-wires is insulated. However, when the HDP film is deposited by the CVD method, a plasma charge infiltrates into the semiconductor device through the metal wires. This causes the leakage current between the select source line and the common source line to occur over a reference value (for example, $5 \times 10^{-12}$ A). As between-the select source line and the common source line is isolated by an insulating film, it is required that the leakage current of over a given reference value be not generated. Practically, the leakage current of over a given reference value is not generated in a wafer on which up to a metal wire process is performed. After the HDP film formation process is performed, however, a large amount of the leakage current is generated.

SUMMARY OF THE INVENTION

Accordingly, the present invention has been made in view of the above problems, and it is an object of the present invention to provide a method of forming a passivation film of a semiconductor device in which the leakage current between a select source line and a common source line can be reduced significantly.

Another object of the present invention is to provide a structure of a passivation film of a semiconductor device in which the leakage current between a select source line and a common source line can be reduced greatly.

To achieve the above object, according to the present invention, there is provided a method of forming a passivation film of a semiconductor device, comprising the steps of forming metal wires on a semiconductor substrate, forming a buffer oxide film being a first passivation film on the metal wires, wherein the buffer oxide film can mitigate damage by plasma, forming a HDP film being a second passivation film on the buffer oxide film, and forming a third passivation film on the second passivation film.

Preferably, the buffer oxide film and the HDP film are formed in-situ in the same chamber.

The buffer oxide film is formed by not applying a bias power or a bias power lower than 1000 W through chemical reaction in a state where ions of a plasma state do not physically collide against the semiconductor substrate.

The buffer oxide film can be composed of a silicon oxide film by using a silane ($SiH_4$) gas as a silicon source gas and oxygen ($O_2$) as an oxygen source gas.

The buffer oxide film can be formed by implanting a silicon source gas and an oxygen source gas and applying a source power of 1000 to 5000 W and a bias power of 0 W to 1000 W at a temperature of 250° C. to 400° C. and a pressure of 1 mTorr to 15 mTorr. The silicon source gas is a silane gas and the oxygen source gas is an oxygen gas, and the buffer oxide film can be formed by implanting the silicon source gas at the flow rate of 10 sccm to 100 sccm and the oxygen source gas at the flow rate of 15 sccm to 200 sccm.

The buffer oxide film is formed to a thickness of about 50 Å to 2000 Å, which is a thickness of the degree that can sufficiently prevent a plasma charge from infiltrating into the metal wire when the HDP film is formed.

The HDP film can be formed by implanting a silane gas and an oxygen gas and applying a source power of 1000 W to 5000 W and a bias power of 1000 W to 4000 W at a temperature of 250° C. to 400° C. and a pressure of 1 mTorr to 15 mTorr. The HDP film can be formed by implanting the silane gas at the flow rate of 30 sccm to 150 sccm and the oxygen gas at the flow rate of 40 sccm to 300 sccm.

The third passivation film can be formed using a silicon nitride film. The silicon the nitride film can be formed by means of a PECVD method and can be formed by implanting a silicon source gas and a nitrogen source gas and applying a high frequency power of 300 W to 2000 W at a temperature of 300° C. to 400° C. and a pressure of 1 mTorr to 15 mTorr.

Further, according to the present invention, there is provided a structure of a passivation film of a semiconductor device, comprising a buffer oxide film formed on a semiconductor substrate in which metal wires are formed along steps formed by the metal wires, wherein the buffer oxide film serves to mitigate damage by plasma, a HDP film formed on the buffer oxide film in thickness of the degree that fills gaps between the metal wires, and a nitride film formed on the HDP film, wherein the nitride film serves to prevent moisture from infiltrating from the outside, wherein the structure of the passivation film has a three-layered structure having the buffer oxide film, the HDP film and the nitride film.

DETAILED DESCRIPTION OF PREFERRED EMBODIMENTS

Figure 1:
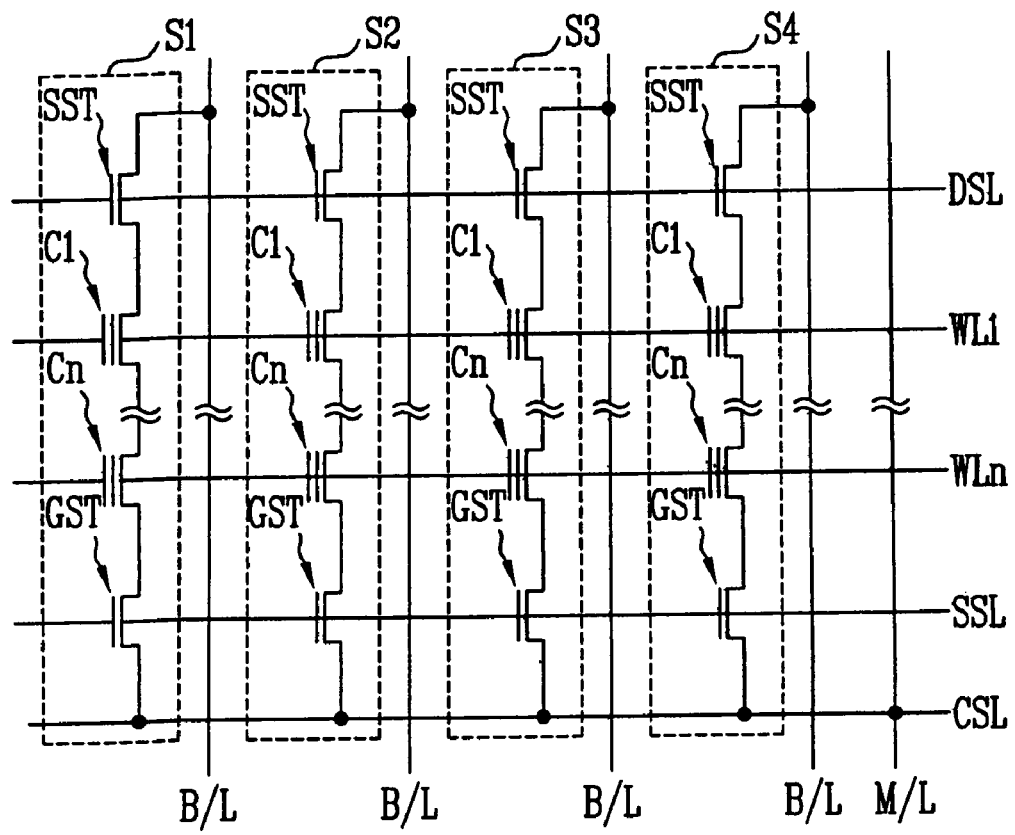
FIG. 1 is an equivalent circuit diagram showing some of a cell array region of a NAND type flash memory device.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate. Further, in the drawing, the thickness and size of each layer are exaggerated for convenience of explanation and clarity. Like reference numerals are used to identify the same or similar parts.

It was found that when the leakage current is measured after metal wires are formed, a leakage current characteristic is normal, whereas the leakage current abruptly increases after a passivation film is formed. This is because a plasma charge generated when a HDP film is deposited has a bad influence upon the leakage current characteristic. The HDP film being a second passivation film is deposited by applying a high bias power in order to bury the metal wires. Accordingly, experimental results show that the leakage current characteristic is degraded. In order to solve this problem, it is necessary to use a buffer oxide film capable of preventing damage by plasma before the HDP film of the second passivation film is deposited.

The buffer oxide film is deposited in-situ in a HDP film deposition process. That is, after the buffer oxide film is formed at an initial step of depositing the HDP film, the HDP film deposition process for burying the gaps between the metal wires is performed in a subsequent process. To this end, in the step of forming the buffer oxide film, it is required that the bias power applied to the substrate be minimized. In other words, by minimizing or not using the bias power, an oxide film must be formed through chemical reaction in a state where ions of a plasma state do not physically collide against the semiconductor substrate. If this principle is employed, physical damage applied to the metal wires can be prohibited by maximum upon deposition of the buffer oxide film. It is also possible to prevent generation of the leakage current between the select source line and the common source line.

FIG. 1 is an equivalent circuit diagram showing some of a cell array region of a NAND type flash memory device.

Referring to FIG. 1, the cell array region of the NAND type flash memory has a plurality of strings, e.g., first to fourth strings S1, S2, S3 and S4. One string is connected to 16 or 32 cells. Each string includes a string select transistor SST, a plurality of cells transistors C1, . . . , Cn and a ground select transistor GST. Gate electrodes of the string select transistors SST are connected to one string select line DSL. Gate electrodes of the ground select transistors GST are connected to one select source line SSL. A control gate electrode of a first cell transistor of each of the strings is connected to a first word line WL1. A control gate electrode of an $n^{th}$ cell transistor Cn of each of the strings is connected to a word line WLn. A drain region of the string select transistor SST is connected to a bit line B/L. A source region of the ground select transistor GST is connected to the common source line CSL. The plurality of the bit lines B/L are positioned in the direction to cross the plurality of the word lines WL1, . . . , WLn. The common source line CSL is positioned in the direction parallel to the select source line SSL. The common source line CSL is connected to a metal wire M/L parallel to the bit lines B/L. The metal wire M/L is a wire for connecting the common source line CSL to a peripheral region (not shown).

A method of forming a passivation film of a semiconductor device according to a preferred embodiment of the present invention will now be described with reference to the accompanying drawings.

FIGS. 2 to 5 are cross-sectional views for explaining a method of forming a passivation film of a semiconductor device according to a preferred embodiment of the present invention.

Figure 2:
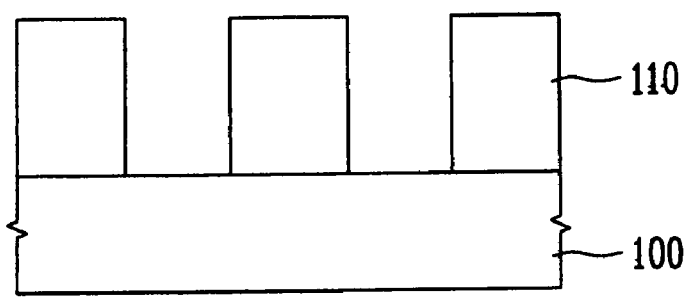
FIGS. 2 to 5 are cross-sectional views for explaining a method of forming a passivation film of a semiconductor device according to a preferred embodiment of the present invention.

Referring to FIG. 2, a metal wire 110 is formed on a semiconductor substrate 100. The metal wire 110 can be a single-layer metal wire. Though not shown in the semiconductor substrate 100, a string select transistor, a cell transistor, a ground select transistor, a select source line, a word line, a string select line, a common source line, a bit line and the like, which are described with reference to FIG. 1, can be formed in the semiconductor substrate 100. A depth between the metal wires 110 can be, e.g., 5000 Å to 15000 Å.

Figure 3:
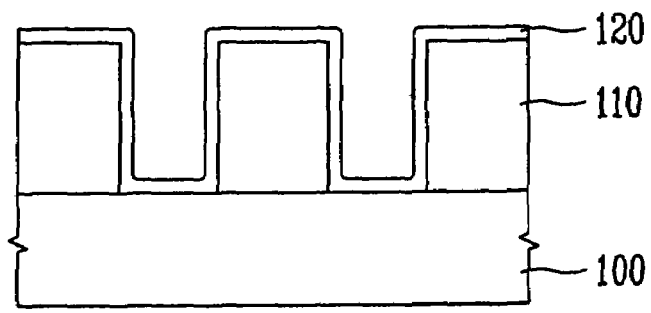

Referring to FIG. 3, a buffer oxide film 120 being a first passivation film, which can mitigate damage by plasma, is formed on the semiconductor substrate 100 on which the metal wire 110 is formed. The buffer oxide film 120 can be formed using an oxide film having low compressive or tensile stress. When the buffer oxide film 120 is formed, a bias power applied to the semiconductor substrate is preferably minimized. That is, by minimizing or not using the bias power, the buffer oxide film 120 can be formed in a state where ions of a plasma state do not physically collide against the semiconductor substrate (or the metal wire) but through chemical reaction. When the buffer oxide film 120 is formed, the bias power is not applied, or a bias power of the degree that physical collision against the semiconductor substrate (or the metal wire) by plasma can occur very little, e.g., a bias power of below 1000 W is applied. The buffer oxide film 120 can be formed using a silicon oxide film ($SiO_2$) by using a silane ($SiH_4$) gas as a silicon source gas and oxygen ($O_2$) as an oxygen source gas. For example, the buffer oxide film 120 can be formed by implanting a silicon source gas and an oxygen source gas and applying a source power of about 1000 W to 5000 W and a bias power of about 0 W to 1000 W at a temperature of about 250° C. to 400° C. and a pressure of about 1 mTorr to 15 mTorr. In this time, the flow rate of the silicon source gas is set to about 10 sccm to 100 sccm and the flow rate of the oxygen source gas is set to about 15 sccm to 200 sccm. Upon formation of the buffer oxide film 120, an ambient gas may employ argon (Ar), helium (He), nitrogen ($N_2$), etc. The buffer oxide film 120 is formed to a thickness that can sufficiently prevent a plasma charge from infiltrating into the metal wires when the HDP film is formed, e.g., about 50 Å to 2000 Å.

Figure 4:
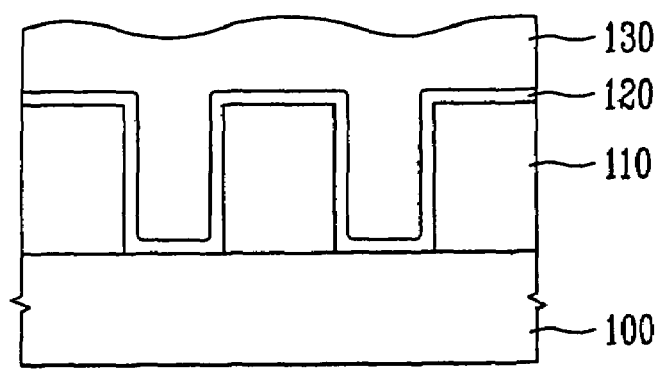

Referring to FIG. 4, a HDP film 130 being a second passivation film is formed on the semiconductor substrate 100 on which the buffer oxide film 120 is formed to a thickness that can completely bury at least between-the-metal wires 110. It is preferred that the HDP film 130 is formed in-situ consecutively in an equipment (a chamber) in which the buffer oxide film 120 is formed. The HDP film 130 can be formed by a chemical vapor deposition (CVD) method. The HDP film 130 is formed by applying a bias power of about 1000 W to 4000 W. The HDP film 130 can be formed using a silicon oxide film ($SiO_2$) by using a silane ($SiH_4$) gas as a silicon source gas and oxygen ($O_2$) as an oxygen source gas. For example, the HDP film 130 can be formed by implanting the silicon source gas and the oxygen source gas and applying a source power of about 1000 W to 5000 W and a bias power of about 1000 W to 4000 W at a temperature of about 250° C. to 400° C. and a pressure of about 1 mTorr to 15 mTorr. In this time, the flow rate of the silicon source gas is set to about 30 sccm to 150 sccm and the flow rate of the oxygen source gas is set to about 40 sccm to 300 sccm. Upon formation of the HDP film 130, an ambient gas may employ argon (Ar), helium (He), nitrogen ($N_2$), etc. The HDP film 130 is formed to at least thickness that can completely bury the gaps between the metal wires, e.g., about 3000 Å to 15000 Å.

Figure 5:
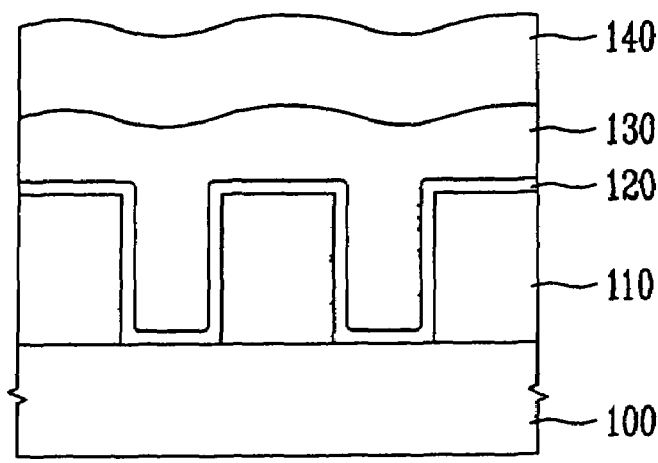

Referring to FIG. 5, a third passivation film 140 that can prevent infiltration of moisture, etc. is formed over the semiconductor substrate 100 on which the HDP film 130 is formed. The third passivation film 140 can be formed using a silicon nitride film ($Si_3N_4$) or a silicon oxynitride (SiON) film. The third passivation film 140 can be formed by means of a plasma enhanced-chemical vapor deposition (PECVD) method. The third passivation film 140 can be formed using a silicon nitride film ($Si_3N_4$) by using a silane ($SiH_4$) or TEOS (Tetra Ethyl Ortho Silicate) gas as a silicon source gas and $N_2O$, $NH_3$ or a mixed gas of them as a nitrogen source gas. For example, the third passivation film 140 can be formed by implanting a silicon source gas and a nitrogen source gas and applying a source power of about 300 W to 2000 W at a temperature of about 300° C. to 400° C. and a pressure of about 1 mTorr to 20 mTorr. In this time, the flow rate of the silicon source gas is set to about 5 sccm to 30 sccm and the flow rate of the nitrogen source gas is set to about 10 sccm to 100 sccm. Upon formation of the third passivation film 140, an ambient gas may employ argon (Ar), helium (He), nitrogen ($N_2$), etc. The third passivation film 140 is formed to a thickness which can prevent infiltration of moisture from the outside, e.g., about 2000 Å to 10000 Å.

The passivation film of the semiconductor device according to an embodiment of the present invention has a three-layered structure including the buffer oxide film 120 that is formed on the semiconductor substrate 100 on which the metal wire 110 is formed along the step generated by the metal wire 110, wherein the buffer oxide film 120 can mitigate damage by plasma, the HDP film 130 that is formed on the buffer oxide film 120 in thickness of the degree that can bury the gaps between the metal wires 110, and the nitride film 140 formed on the HDP film 130, for preventing infiltration of moisture from the outside.

The amount of current that is leaked when a positive voltage of 5V is applied to the select source line SSL or the common source line CSL is shown in Table 1 and 2. Table 1 and 2 indicate the leakage current that is measured against a test pattern for monitoring a main cell. In these tables, respective points of a wafer are specified and measured values of the leakage current at the respective points are shown in Table 1 and 2 so that they correspond to the respective points of the wafer.

From Table 1, it can be seen that the leakage current of over a given reference value (for example, $5 \times 10^{-12}$ A) is not generated in a wafer on which up to a metal wire process is performed (the leakage current is measured without forming a passivation film).

TABLE 1

|  |  |  | 6.00E–14 | 6.00E–14 | 6.00E–14 | 8.00E–14 |  |  |
|---|---|---|---|---|---|---|---|---|
|  |  | 1.00E–13 | 8.00E–14 | 1.00E–07 | 1.20E–13 | 1.00E–13 | 1.00E–13 |  |
| 8.00E–14 | 1.40E–13 | 1.40E–13 | 1.20E–13 | 1.00E–13 | 1.40E–13 | 1.20E–13 | 1.20E–13 |  |
| 1.40E–13 | 1.20E–13 | 1.00E–13 | 1.20E–13 | 6.00E–13 | 1.40E–13 | 1.20E–13 | 1.40E–13 |  |
| 1.60E–13 | 1.80E–13 | 1.20E–13 | 1.20E–13 | 8.00E–14 | 1.00E–13 | 1.20E–13 | 1.00E–13 |  |
| 4.00E–14 | 1.20E–13 | 1.00E–13 | 1.00E–13 | 1.20E–13 | 1.20E–13 | 1.40E–13 | 1.20E–13 |  |
| 1.20E–13 | 1.40E–13 | 1.20E–13 | 1.00E–13 | 1.60E–13 | 1.40E–13 | 1.20E–13 | 1.40E–12 |  |
|  |  | 1.40E–13 | 1.20E–13 | 1.40E–13 | 1.40E–13 | 1.40E–13 | 1.20E–13 |  |
|  |  |  | 1.00E–13 | 1.20E–13 | 1.20E–13 | 8.00E–14 |  |  |

Table 2 below shows values of the leakage current after a HDP film and a third passivation film are formed without forming a buffer oxide film. In this time, the HDP film is formed by implanting a silane gas and an oxygen gas and applying a source power of about 4400 W and a bias power of about 2750 W at a temperature of about 350° C. and a pressure of about 5 mTorr. In this time, the flow rate of the silane gas is set to about 85 sccm and the flow rate of the oxygen gas is set to about 150 sccm. When the HDP film is formed, an argon gas is used as an ambient gas. The HDP film is formed to a thickness of about 9000 Å. Furthermore, the third passivation film is formed by implanting a silane gas, and a $N_2O$ and $NH_3$ gas being a nitrogen source gas and applying a high frequency power of about 300 W at a temperature of about 400° C. and a pressure of about 4 Torr. In this time, the flow rate of the silane gas is set to about 250 sccm, the flow rate of the $N_2O$ gas is set to about 3000 sccm and the flow rate of the $NH_3$ gas is set to about 3500 sccm. When the third passivation film is formed, a $N_2$ gas is used as an ambient gas. The third passivation film is formed to a thickness of about 10000 Å.

From Table 2, it can be seen that the leakage current of over a predetermined reference value (for example, $5 \times 10^{-12}$ A) is generated in great quantities after the passivation film formation process is performed without forming the buffer oxide film.

TABLE 2

|  |  |  | 5.11E–09 | 1.59E–11 | 1.55E–10 | 2.44E–10 |  |  |
|---|---|---|---|---|---|---|---|---|
|  |  | 1.80E–10 | 7.69E–10 | 2.68E–09 | 1.00E–07 | 3.37E–09 | 1.40E–13 |  |
| 1.46E–11 | 8.46E–10 | 3.06E–09 | 1.00E–07 | 1.00E–07 | 4.42E–09 | 9.41E–10 | 8.00E–14 |  |
| 4.46E–10 | 2.09E–09 | 1.65E–09 | 1.00E–07 | 1.00E–07 | 1.00E–07 | 4.57E–09 | 7.30E–12 |  |
| 7.68E–10 | 1.00E–07 | 7.58E–09 | 3.00E–09 | 1.00E–07 | 1.00E–07 | 2.61E–09 | 1.00E–07 |  |
| 1.56E–09 | 2.21E–07 | 3.12E–09 | 1.00E–07 | 1.00E–07 | 6.38E–09 | 8.73E–09 | 5.60E–13 |  |
| 1.04E–09 | 1.00E–07 | 1.00E–07 | 3.19E–09 | 1.98E–09 | 1.75E–09 | 2.04E–10 | 9.80E–13 |  |
|  |  | 1.84E–09 | 3.17E–09 | 4.98E–10 | 1.00E–07 | 1.54E–10 | 1.00E–13 |  |
|  |  |  | 8.54E–11 | 9.76E–12 | 1.85E–09 | 1.00E–07 |  |  |

Figure 6:
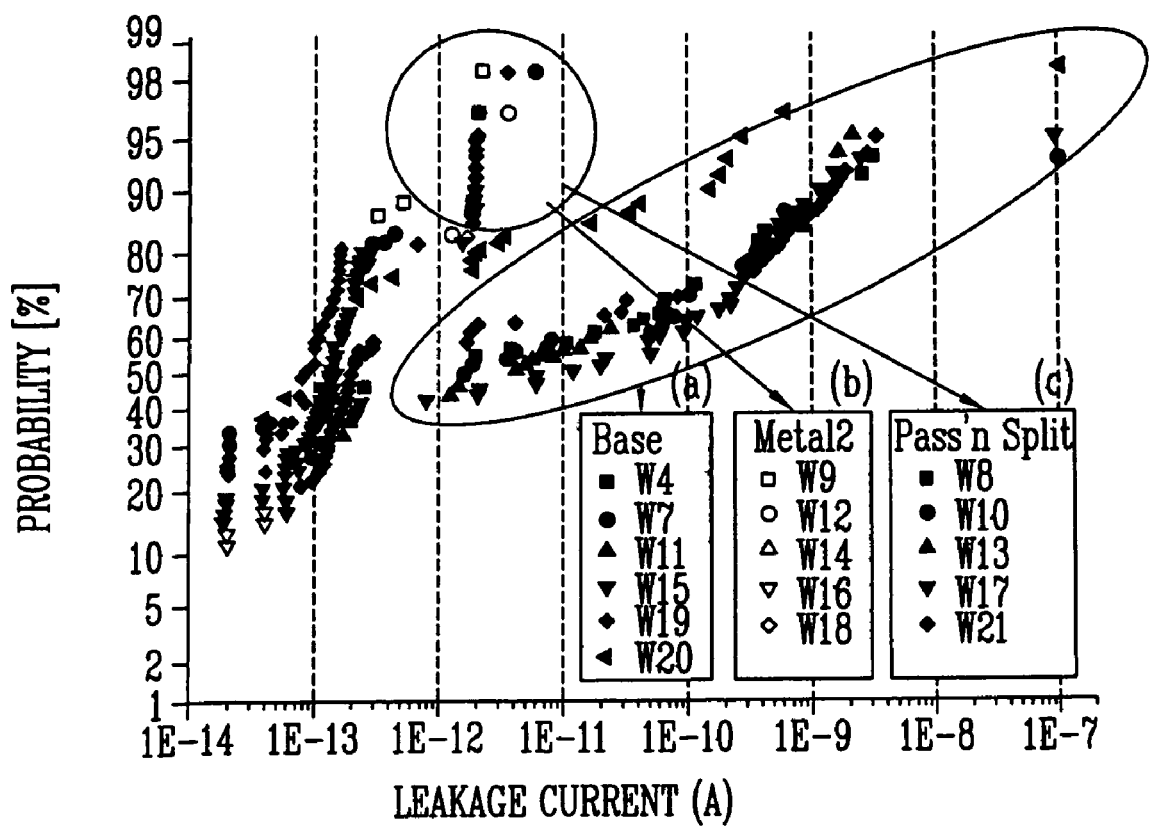
FIG. 6 is a graph showing a leakage current characteristic depending on whether a buffer oxide film is formed in the NAND type flash memory device.

FIG. 6 is a graph showing a leakage current characteristic depending on whether a buffer oxide film is formed in the NAND type flash memory device.

In FIG. 6, the deposition condition of the HDP film and the third passivation film is the same as in Table 2. In FIG. 6, the buffer oxide film is formed by implanting a silane gas and an oxygen gas and applying a source power of about 4400 W and a bias power of about 0 W at a temperature of about 350° C. and a pressure of about 5 mTorr. In this time, the flow rate of the silane gas is set to about 53 sccm and the flow rate of the oxygen gas is set to about 105 sccm. When the buffer oxide film is formed, an argon gas is used as an ambient gas and the buffer oxide film is formed to a thickness of about 1000 Å.

If the buffer oxide film is not formed but the HDP film is formed as in the prior art ((a) in FIG. 6), a large amount of the leakage current is generated between the select source line and the common source line. On the contrary, if the buffer oxide film is first formed and the HDP film is then formed ((c) in FIG. 6), the leakage current is rarely generated. In FIG. 6, (b) indicates values of the leakage current of a wafer on which up to the metal wire process is performed (the leakage current is measured without forming the passivation film). From FIG. 6, it can be seen that the buffer oxide film sufficiently serves as a plasma charge blocking layer.

Of course, the similar effect can be obtained although the buffer oxide film is formed ex-situ in a chamber other than the HDP film deposition chamber before the HDP film is deposited. In this case, however, there are disadvantages in that the turn around time (TAT) becomes slow and the process increases.

Accordingly, it is preferred that the buffer oxide film and the HDP film are formed in-situ in the same chamber. If the in-situ process is used, improved results are obtained in terms of the leakage current compared to a conventional method, while there are advantages in that additional process is not needed and it is advantageous in terms of TAT in comparison with a case where the buffer oxide film and the HDP film are formed ex-situ.

As described above, according to the present invention, a buffer oxide film is formed before a HDP film is formed. Accordingly, it is possible to reduce the leakage current between a select source line and a common source line significantly.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A structure of a passivation film of a semiconductor device, comprising:
   a buffer oxide film formed on a semiconductor substrate in which metal wires are formed along steps formed by the metal wires, wherein the buffer oxide film mitigates damage by plasma;
   a high density plasma (HDP) film formed on the buffer oxide film in a thickness sufficient to fill gaps between the metal wires; and
   a nitride film formed on the HDP film, wherein the nitride film prevents moisture from infiltrating from the outside, wherein the structure of the passivation film has a three-layered structure comprising the buffer oxide film, the HDP film, and the nitride film.

2. The structure of claim 1, wherein the buffer oxide film has a thickness of 50 Å to 2000 Å.

3. The structure of claim 1, wherein the HDP film is sufficiently thick to completely bury the gaps between the metal wires.

4. The structure of claim 1, wherein the HDP film has a thickness of 3000 Å to 15000 Å.

5. The structure of claim 1, wherein the nitride film has a thickness of 2000 Å to 10000 Å.

* * * * *